(12) United States Patent
Park

(10) Patent No.: US 10,299,378 B2
(45) Date of Patent: May 21, 2019

(54) POLYMER RESIN COMPOSITION, POLYIMIDE RESIN FILM, PREPARATION METHOD OF POLYIMIDE RESIN FILM, FLEXIBLE METAL LAMINATE, AND CIRCUIT BOARD

(75) Inventor: Soon Yong Park, Daejeon (KR)

(73) Assignee: SHENGYI TECHNOLOGY CO., LTD., Dongguan, Guangdong (CN)

( * ) Notice: Subject to any disclaimer, the term of this patent is extended or adjusted under 35 U.S.C. 154(b) by 1050 days.

(21) Appl. No.: 14/342,267

(22) PCT Filed: Aug. 28, 2012

(86) PCT No.: PCT/KR2012/006869
§ 371 (c)(1),
(2), (4) Date: Feb. 28, 2014

(87) PCT Pub. No.: WO2013/032211
PCT Pub. Date: Mar. 7, 2013

(65) Prior Publication Data
US 2014/0220330 A1    Aug. 7, 2014

(30) Foreign Application Priority Data

Aug. 30, 2011 (KR) .................. 10-2011-0087286
Aug. 27, 2012 (KR) .................. 10-2012-0093687

(51) Int. Cl.
*H05K 1/03* (2006.01)
*H05K 3/00* (2006.01)
*C08G 73/10* (2006.01)

(52) U.S. Cl.
CPC ........... *H05K 1/0346* (2013.01); *C08G 73/10* (2013.01); *H05K 1/0393* (2013.01); *H05K 2201/0154* (2013.01); *Y10T 428/24999* (2015.04); *Y10T 428/249977* (2015.04); *Y10T 428/31681* (2015.04)

(58) Field of Classification Search
CPC ... H05K 1/0346; H05K 3/0055; H05K 1/0393

USPC ................... 524/56, 377; 428/220
See application file for complete search history.

(56) References Cited

U.S. PATENT DOCUMENTS

| | | | | |
|---|---|---|---|---|
| 6,133,408 A | * | 10/2000 | Chiu ................ | B32B 15/08 428/209 |
| 6,746,816 B2 | * | 6/2004 | Hayashi .............. | G03F 7/0045 430/270.1 |
| 2002/0055062 A1 | * | 5/2002 | Hayashi .............. | G03F 7/0045 430/270.1 |
| 2009/0321123 A1 | * | 12/2009 | Lochtman ........... | H05K 3/4664 174/261 |

FOREIGN PATENT DOCUMENTS

| | | |
|---|---|---|
| CN | 1423169 A | 6/2003 |
| CN | 101371197 A | 2/2009 |
| CN | 101675386 A | 3/2010 |
| EP | 2354180 A1 | 8/2011 |
| JP | 11-323256 A | 11/1999 |
| JP | 2001-294704 A | 10/2001 |
| JP | 2002-003636 A | 1/2002 |
| JP | 2002-148804 A | 5/2002 |
| JP | 2011-132390 A | 7/2011 |
| KR | 10-2001-051941 A | 6/2001 |
| KR | 10-2007-0113631 A | 11/2007 |
| KR | 20070113631 A | 11/2007 |
| KR | 10-2009-0019739 A | 2/2009 |
| KR | 10-2009-0089002 A | 8/2009 |
| KR | 10-2011-0084849 A | 7/2011 |
| KR | 20110084849 A | 7/2011 |
| TW | 528930 B | 4/2003 |
| TW | 200919084 A | 5/2009 |

* cited by examiner

*Primary Examiner* — Deve E Valdez
(74) *Attorney, Agent, or Firm* — Rothwell, Figg, Ernst & Manbeck, P.C.

(57) ABSTRACT

The present invention is related to a polymer resin composition capable of providing an insulating material having a low dielectric constant and excellent mechanical properties, a polyimide resin film obtained by using the polymer resin composition, a preparation method of a polyimide resin film, and a circuit board and a metal laminate including the polyimide resin film.

29 Claims, 1 Drawing Sheet

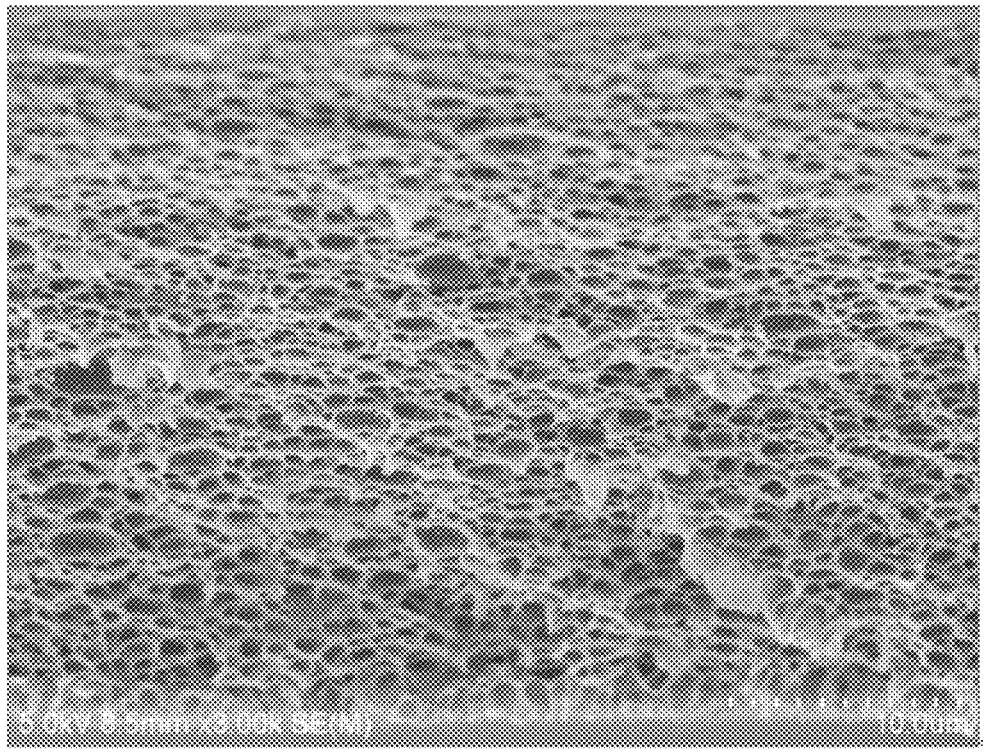

POLYMER RESIN COMPOSITION, POLYIMIDE RESIN FILM, PREPARATION METHOD OF POLYIMIDE RESIN FILM, FLEXIBLE METAL LAMINATE, AND CIRCUIT BOARD

CROSS REFERENCE TO RELATED APPLICATIONS

This application is a 35 U.S.C. § 371 National Phase Entry Application from PCT/KR2012/006869, filed Aug. 28, 2012, and designating the United States, which claims priority under 35 U.S.C. § 119 to Korean Patent Application No. 10-2011-0087286 filed Aug. 30, 2011 and to Korean Patent Application No. 10-2012-0093687 filed Aug. 27, 2012, which are incorporated herein in their entireties.

TECHNICAL FIELD

The present invention is related to a polymer resin composition, a polyimide resin film, a preparation method of polyimide resin film, a flexible metal laminate, and a circuit board. More specifically, the present invention is related to a polymer resin composition capable of providing an insulating material having a low dielectric constant and excellent mechanical properties, a polyimide resin film obtained by using the polymer resin composition, a preparation method of the polyimide resin film, and a circuit board and a metal laminate including the polyimide resin film.

BACKGROUND OF THE INVENTION

Recently, as electronic devices have become more compact and multifunctional, and portable devices in particular have become lighter, thinner, and smaller, a circuit board used in the electronic devices has been required to have high density.

Thus, in order to increase the degree of integration of a circuit board within the same space, a multilayer circuit board, a circuit having flexibility to be installed in a narrow space, and a method of reducing the thickness of a metal layer for implementing a fine pattern on a circuit board have been used.

In particular, in the field of information processing and communication, in order to transfer and process large amounts of information at a high speed, the operating frequency of the CPU has been raised. An insulating layer having a low dielectric constant and excellent mechanical properties has been used so as to minimize a phenomenon in which signal propagation speed is delayed by the insulating layer.

A polyimide resin, which has excellent physical properties such as high heat resistance, dimensional stability, chemical resistance, and a relatively low dielectric constant, is widely used in electronic and electrical appliances such as for a circuit board and for insulating materials and parts where high reliability is required.

Typically, a polyimide resin is obtained by coating a polyamic acid on a substrate and heating the polyamic acid. But because the obtained polyimide resin generally has a dielectric constant of 3.0 or higher, the dielectric constant of the polyimide resin is required to be reduced so as to apply it to a field requiring a higher degree of integration and high-speed operation.

A polyamic acid and polyimide resin in various forms have been proposed, but methods that can be used while maintaining or improving the mechanical properties, to reduce the dielectric constant below a certain level, are not well known.

For example, a proposal to reduce polyimide π electrons to reduce the dielectric constant has been presented, but according to this, heat resistance of a polyimide resin is reduced and solder adhesion is broken. Further, the alicyclic unit has high solubility to an organic solvent, thus use of a produced film is limited, and the polyimide cannot have a sufficient dielectric constant for application for high speed operation and high circuit densities.

Thus, a polyimide resin having excellent mechanical properties with a low dielectric constant, that can minimize interference between signals, and that can greatly increase transfer speed is required.

DETAILED DESCRIPTION OF THE INVENTION

Technical Objectives

An aspect of the present invention provides a polymer resin composition capable of providing an insulating material having a low dielectric constant and excellent mechanical properties.

Another aspect of the present invention provides a polyimide resin film having a low dielectric constant and excellent mechanical properties.

A further aspect of the present invention provides a preparation method of the polyimide resin film.

Another aspect of the present invention provides a metal laminate including the polyimide resin film.

Still another aspect of the present invention provides a circuit board including the polyimide resin film.

Technical Solutions

The present invention provides a polymer resin composition including a polyamic acid, and at least one compound selected from the group consisting of a polyalkylene oxide compound, a tetrahydropyran compound, polystyrene, a polyacrylate compound, and a copolymer thereof.

The present invention also provides a polyimide resin film including a heat cured product or dried product of the polymer resin composition.

The present invention further provides a preparation method of the polyimide resin film, which includes applying the polymer resin composition onto a substrate and heating the polymer resin composition.

The present invention also provides a flexible metal laminate including the polyimide resin film and a metal thin film.

In addition, the present invention provides a circuit board including the polyimide resin.

Hereinafter, a polymer resin composition, a polyimide resin film, a preparation method of the polyimide resin film, a flexible metal laminate, and a circuit board according to the specific embodiments of the present invention is explained in more detail.

According to one embodiment of the present invention, there is provided a polymer resin composition including: a polyamic acid including a repeating unit represented by the following Chemical Formula 1; and at least one compound selected from the group consisting of a polyalkylene oxide compound, a tetrahydropyran compound, polystyrene, a polyacrylate compound, and a copolymer thereof.

[Chemical Formula 1]

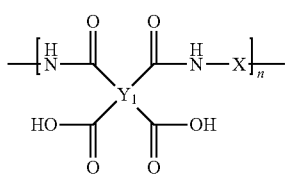

In Chemical Formula 1, $Y_1$ is a tetravalent organic functional group, X is a divalent organic functional group, and n is an integer of 1 to 100.

The present inventors progressed from related studies, and through experiments, recognized that a polymer resin composition obtained by mixing s specific thermally decomposable compound and s polyamic acid can provide an insulating material having a low dielectric constant and excellent mechanical properties.

Specifically, when the polymer resin composition is heated at a temperature of more than 50° C., for example 200° C. to 500° C., preferably from 200° C. to 430° C., more preferably from 300° C. to 410° C., the polyamic acid including a repeating unit represented by the Chemical Formula 1 is imidized and the specific thermally decomposable compound is decomposed at the same time. Thus, a polyimide resin having a uniform distribution of fine pores can be provided A dielectric constant of the fine pores is about 1, thus a dielectric constant of the polyimide resin in which fine pores are uniformly distributed can be lowered significantly. In particular, at least one compound selected from the group consisting of a polyalkylene oxide compound, a tetrahydropyran compound, polystyrene, a polyacrylate compound, and a copolymer thereof are phase-separated with the polyamic acid during coating and drying processes of the polymer resin composition, and thus pores having an appropriate size or domains for forming pores can be formed. Furthermore, because the compound(s) is not thermally decomposed below the temperature at which the curing of the polyamic acid starts (about 200° C.) and is totally thermally decomposed in the range from the temperature at which the curing of the polyamic acid starts to the temperature at which the thermal-decomposition of polyimide occurs (about 500° C.), the pores formed by phase separation (or domains) do not have a significant change in shape, and then the fine holes having a proper size and shape may be formed inside of the polyimide resin film.

Further, the above-mentioned at least one compound selected from the group consisting of a polyalkylene oxide compound, a tetrahydropyran compound, polystyrene, a polyacrylate compound, and a copolymer thereof are easy to obtain, and it can be completely thermally decomposed even inside of the polymer resin composition or polymer resin film in a relatively low temperature range, e.g. 200° C. to 430° C., and preferably 300° C. to 410° C.

The pores are formed by phase separation between the above-mentioned at least one compound selected from the group consisting of a polyalkylene oxide compound, a tetrahydropyran compound, polystyrene, a polyacrylate compound, and a copolymer thereof and polyamic acid, or domains for forming the pores respectively distributed in the resin composition or resin film with an independent state without connecting with other pores or domains are formed. Thus, as a pore or domain is distributed in the composition or film in an independent state (closed pore), the produced film can have a lower dielectric constant and enhanced insulation in high voltage conditions.

Therefore, by using the polymeric resin composition, a polyimide resin film having suitable properties for the circuit board of a base film, laminated film, or protective film can be provided.

Meanwhile, by using the polymer resin composition according to the embodiment of the invention, without adding a separate process for forming pores or reducing the dielectric constant, the specific compounds described above can be thermally decomposed to form the fine pores while heat-treating the resin composition to form the polyimide film, and the manufacturing process of the circuit board or the manufacturing process of the polyimide film, which are previously known in the related art, can be used.

A method of introducing a thermally decomposable repeating unit or functional group into polyimide or polyamic acid is previously known, but the introducing a thermally decomposable repeating unit or functional group into polyimide or polyamic acid is not easy. Further, the molecular weight of the repeating unit of the thermally decomposable repeating unit or the functional group should be adjusted so as to sufficiently lower the dielectric constant of the polyimide film, however the adjustment of the molecular weight ratio of the repeating unit of the thermally decomposable repeating unit or the functional group to the main chain of polyimide polymer is not easy. Furthermore, a size of pores formed by decomposing the thermally decomposable repeating unit or the functional group is about tens of nanometers, and the strength of a prepared polyimide film is lowered.

On the other hand, since the polymer resin composition according to the embodiment of the invention includes at least one compound selected from the group consisting of a polyalkylene oxide compound, a tetrahydropyran compound, polystyrene, a polyacrylate compound, and a copolymer thereof, fine pores which bring a low dielectric constant while maintaining excellent mechanical properties can be formed without being limited to a molecular weight or chemical structure of a compound mentioned above.

The polymer resin composition includes at least one compound selected from the group consisting of a polyalkylene oxide compound, a tetrahydropyran compound, polystyrene, a polyacrylate compound, and a copolymer thereof in a range of 5 wt % to 70 wt %, and preferably 10 wt % to 50 wt %. If the content of the above compounds is too large, the strength of the produced film may be excessively lowered, while if the content is too small, pores are not sufficiently formed in the polymer film, or the dielectric constant of the film may not be sufficiently lowered.

As described above, the polyalkylene oxide compound, the tetrahydropyran compound, the polystyrene, the polyacrylate compound, and the copolymer thereof can be completely thermally decomposed without using an additional solvent or reagent, and substantially no residue is left after the thermal decomposition.

Specifically, the polyalkylene oxide compound includes a polymer of an alkylene oxide having a carbon number of 1 to 10, a copolymer of an alkylene oxide copolymer having a carbon number of 1 to 10, or derivatives thereof.

The polymer of an alkylene oxide having a carbon number of 1 to 10 is a polymer formed by the polymerization of a linear or branched alkylene oxide having a carbon number of 1 to 10. The copolymer of an alkylene oxide copolymer having a carbon number of 1 to 10 is a co-polymer formed by polymerization between at least 2 kind of linear or branched alkylene oxides having a carbon number of 1 to 10.

For example, the polyalkylene oxide compound is a random copolymer or a block copolymer obtained by the reaction of a 1st alkylene oxide having 1 to 5 carbon atoms and a 2nd alkylene oxide having 1 to 5 carbon atoms.

Derivatives of a polymer of alkylene oxide having a carbon number of 1 to 10 or a copolymer of an alkylene oxide having a carbon number of 1 to 10 are a polymer or copolymer of an alkylene oxide having a carbon number of 1 to 10 and having a functional group such as a C1 to C3 alkyl, a hydroxyl group, or an acetate group.

For example, derivatives of a polymer of an alkylene oxide having a carbon number of 1 to 10 or a copolymer of an alkylene oxide having a carbon number of 1 to 10 are a random copolymer or block copolymer having an alkyl group having 1 to 3 carbon atoms, a hydroxy group, or an acetate group at the main chain or terminal, which is formed by reaction of a 1st alkylene oxide having 1 to 5 carbon atoms and a 2nd alkylene oxide having 1 to 5 carbon atoms.

The polyalkylene oxide compound has a number average molecular weight of 5000 to 100,000. If the number average molecular weight of the polyalkylene oxide-based compound is too small, it can be volatilized at a temperature below 200° C. and forming the pores having an appropriate shape or size may not be easy. If the number average molecular weight of the polyalkylene oxide-based compound is too large, the solubility of the compound is lowered and preparing a uniform resin composition may not be easy.

The tetrahydropyran compound includes at least a compound selected from the group consisting of sucrose, cyclodextrin, glucose, and derivatives thereof.

Specifically, the tetrahydropyran compound is a polymer compound including a repeating unit of the following Chemical Formula 2, a compound of the following Chemical Formula 3, or a mixture thereof.

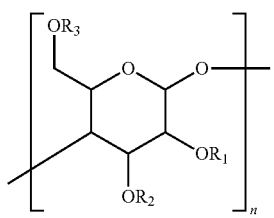

[Chemical Formula 2]

In Chemical Formula 2, $R_1$, $R_2$, and $R_3$ are same as or different from each other and are respectively hydrogen or an alkyl having 1 to 3 carbon atoms, and
n is an integer of 1 to 10.

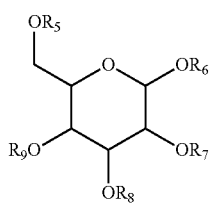

[Chemical Formula 3]

In Chemical Formula 3, $R_5$, $R_6$, $R_7$, $R_8$, and $R_9$ are same as or different from each other and are respectively hydrogen, an alkyl having 1 to 3 carbon atoms, a functional group of the following Chemical Formula 4, or a functional group of the following Chemical Formula 5.

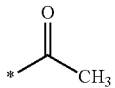

[Chemical Formula 4]

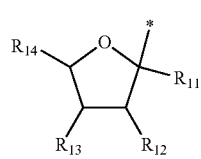

[Chemical Formula 5]

In Chemical Formula 5, $R_{11}$, $R_{12}$, $R_{13}$, and $R_{14}$ are same as or different from each other and are respectively hydrogen, an alkyl having 1 to 3 carbon atoms, an alkoxy having 1 to 3 carbon atoms, a functional group of the following Chemical Formula 6, or a functional group of the following Chemical Formula 7.

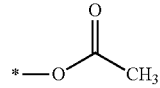

[Chemical Formula 6]

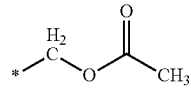

[Chemical Formula 7]

In Chemical Formulae 4 to 7, "*" means a bonding point.

Meanwhile, the polystyrene has repeating units of styrene and a number-average molecular weight of 5000 to 100,000.

The polyacrylate compound includes a repeating unit of an acrylate or methacrylate and a number average molecular weight of 5000 to 100,000.

The polyamic acid has a weight average molecular weight of 10,000 to 1,000,000, and preferably 50,000 to 500,000. In case the weight average molecular weight of the polyamic acid is less than 10,000, the polymer resin composition can't have the desired coating properties and mechanical properties upon applications. In case the weight average molecular weight of polyamic acid is greater than 1,000,000, the viscosity of the composition is too high, and coating processes and transporting can be difficult.

The polymer resin composition includes the polyamic acid at 30 wt % to 95 wt %, and preferably 50 wt % to 90 wt %. In case the content of the polyamic acid is too large, the dielectric constant can't be sufficiently reduced. In case the content of the polyamic acid is too small, the strength of the film can be lowered.

Meanwhile, $Y_1$ is a tetravalent organic functional group, and is preferably a tetravalent organic functional group containing one to three aromatic rings, a tetravalent organic functional group containing one to three aliphatic rings, or a tetravalent aliphatic organic functional group derived from a linear or branched alkyl having 1 to 10 carbon atoms.

Specifically, $Y_1$ is a tetravalent functional group selected from the group consisting of the following Chemical Formulae 21 to 35.

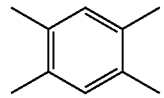

[Chemical Formula 21]

[Chemical Formula 22]

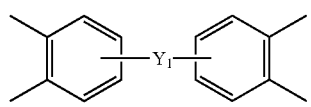

In Chemical Formula 22, $Y_1$ is single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

[Chemical Formula 23]

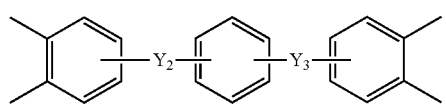

In Chemical Formula 23, $Y_2$ and $Y_3$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

[Chemical Formula 24]

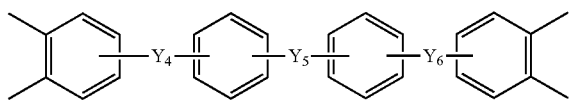

In Chemical Formula 24, $Y_4$, $Y_5$, and $Y_6$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

[Chemical Formula 25]

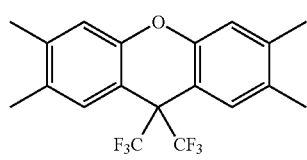

[Chemical Formula 26]

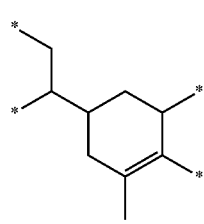

[Chemical Formula 27]

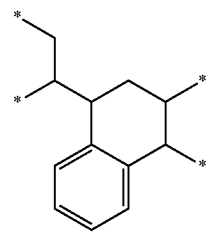

[Chemical Formula 28]

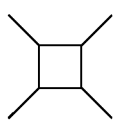

[Chemical Formula 29]

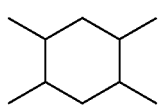

[Chemical Formula 30]

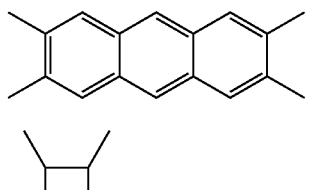

[Chemical Formula 31]

[Chemical Formula 32]

[Chemical Formula 33]

[Chemical Formula 34]

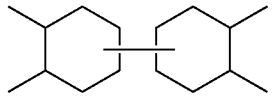

[Chemical Formula 35]

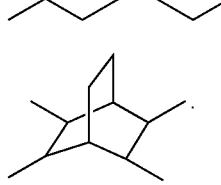

In Chemical Formula 1, X is a divalent organic functional group, preferably a divalent organic functional group selected from the group consisting of a divalent organic functional group containing 1 to 5 aromatic rings, a divalent organic functional group containing 1 to 3 aliphatic rings, a divalent organic functional group having an ether functional group or an ester functional group, and a polysiloxane divalent functional group.

Specifically, X is a divalent functional group selected from the group consisting of compounds of the following Chemical Formulae 36 to 44.

[Chemical Formula 36]

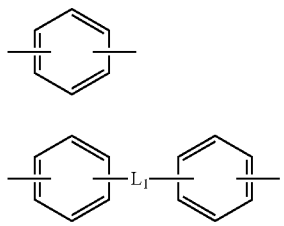

[Chemical Formula 37]

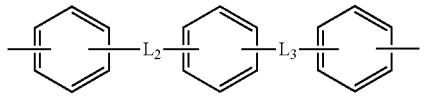

In Chemical Formula 37, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, and n1, n2, and n3 are respectively an integer of 1 to 10.

[Chemical Formula 38]

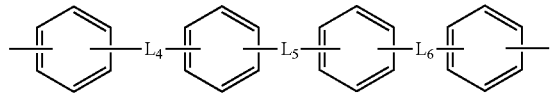

In Chemical Formula 38, $L_2$ and $L_3$ are the same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, and n1, n2, and n3 are respectively an integer of 1 to 10.

[Chemical Formula 39]

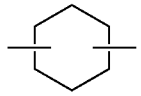

In Chemical Formula 39, $L_4$, $L_5$, and $L_6$ are the same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, and n1, n2, and n3 are respectively an integer of 1 to 10.

[Chemical Formula 40]

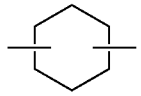

[Chemical Formula 41]

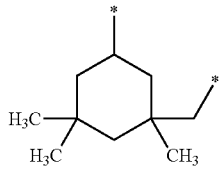

[Chemical Formula 42]

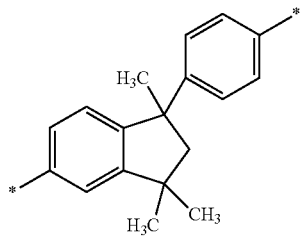

[Chemical Formula 43]

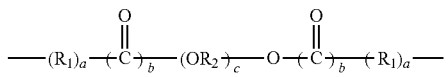

In Chemical Formula 43, $R_1$ is an alkylene having 2 to 8 carbon atoms or arylene, $R_2$ is alkylene having 2 to 8 carbon atoms, a and b are each 0 or 1, and c is an integer from 1 to 21.

[Chemical Formula 44]

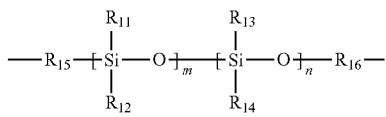

In Chemical Formula 44, $R_{11}$, $R_{12}$, $R_{13}$, and $R_{14}$ are same as or different from each other and are respectively an alkyl group having 1 to 5 carbon atoms or an aryl group having 6 to 10 carbon atoms, $R_{15}$ and $R_{16}$ are respectively a linear or branched chain alkylene group having 1 to 20 carbon atoms, m is an integer of 1 or more, and n is an integer of 0 or more.

The polymer resin composition further includes an organic solvent. The organic solvent may be a typical organic solvent which is well-known to use in a synthesis or manufacturing process of a polyamic acid or a polyimide. For example, N-methylpyrrolidone (NMP), N,N—N,N-dimethylacetamide (DMAc), tetrahydrofuran (THF), N,N-dimethylformamide (DMF), dimethyl sulfoxide (DMSO), cyclohexane, acetonitrile, and mixtures thereof can be used, but is not limited thereto.

The polymer resin composition further includes an organic solvent in a range of 1 wt % to 99 wt %, preferably 50 wt % to 95 wt %, and more preferably 70 wt % to 90 wt %.

The polymer resin composition further includes at least an additive selected from the group consisting of a dispersant, a surfactant, a antioxidant, a cure accelerator, a defoaming agent, an organic filler, and an inorganic filler, so as to adjust the size of the micropores in the polyimide film formed from the polymer resin composition, to facilitate the coating or curing step, or to improve other properties of the polyimide film. The polymer resin composition includes the additives in range of 0.01 wt % to 10 wt %.

According to another embodiment of the present invention, a polyimide resin film including a heat cured product or dried product of the polymer resin composition is provided.

As stated above, when the polymer resin composition according to the embodiment is heated at a temperature of more than 50° C., for example 200° C. to 500° C., preferably from 200° C. to 430° C., and more preferably from 300° C. to 410° C., the polyamic acid including a repeating unit represented by Chemical Formula 1 is imidized and the specific thermally decomposable compound is decomposed at the same time. Thus, a polyimide resin having a uniform distribution of fine pores and an insulating material having a low dielectric constant and excellent mechanical properties can be provided.

Specifically, in the polyimide resin film, fine pores having a diameter of 100 nm to 5 μm is distributed in a substrate of a polyimide polymer including a repeating unit of Chemical Formula 11.

[Chemical Formula 11]

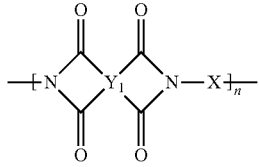

In Chemical Formula 11, $Y_1$ is a tetravalent organic functional group, X is a divalent organic functional group, and n is an integer of 1 to 100.

More specific information about Y1 and X is the same as described in Formula 1.

The polyimide polymer including a repeating unit of Chemical Formula 11 can be formed by imidizing the polyamic acid of Formula 1 at a specific high temperature.

The fine pores distributed in a substrate of a polyimide polymer have a diameter of 100 nm to 5 μm, and preferably 200 nm to 1 μm. In case the size of the fine pore is too large, the fine holes cannot be uniformly distributed throughout the polyimide film, and the dielectric constant can be locally non-uniform. In case the size of the fine pores is too small, the proper porosity can't be obtained and the strength of the polyimide film may be lowered. The diameter of the fine pores means the maximum value of diameter of the fine pore in one section image.

The fine pores distributed in a substrate of a polyimide polymer have a uniform size, and specifically, the standard deviation of the size of the fine pores is 1.2 μm or less, and preferably 1.0 μm or less.

The polyimide resin film, which includes a heat cured product or dried product of the polymer resin composition, has porosity of 5 to 70%, and preferably 10 to 50%. The polyimide resin film having the porosity can obtain appropriate mechanical properties and a low dielectric constant. The porosity of the polyimide resin film can be calculated from the density.

Each of the fine pores is distributed in an independent state without connecting with other pores. The independent state means that each of the fine pores exist in the resin film as a shape of a closed pore.

As stated above, for the phase separation between the above-mentioned at least one compound selected from the group consisting of a polyalkylene oxide compound, a tetrahydropyran compound, polystyrene, a polyacrylate compound, and a copolymer thereof and polyamic acid, the fine pores formed by the phase separation or domains for forming the pores are respectively distributed in the resin composition or resin film in an independent state without connecting with other pores or domains.

The above-mentioned at least one compound selected from the group consisting of a polyalkylene oxide compound, a tetrahydropyran compound, polystyrene, a polyacrylate compound, and a copolymer thereof are easy to obtain, and it can be completely thermally decomposed even inside of the polymer resin composition or polymer resin film in a range of more than 50° C., for example 200° C. to 500° C., preferably from 200° C. to 430° C., and more preferably from 300° C. to 410° C. Thus, a polyimide resin having a uniform distribution of fine pores can be provided, and each of the pores is distributed in an independent state without connecting with other pores.

The polyimide resin film may have a dielectric constant of 3.0 or less, for example 2.9 or less, at 10 GHz.

A conventional polyimide resin film has a dielectric constant of greater than 3.0, and when used in an electronic device in a high frequency region, an excess of noise is generated and the reliability of the electronic circuit can be degraded, thus, it was not suitable as an insulating material. In contrast, the polyimide polymer including a repeating unit of Chemical Formula 11 has a lower dielectric constant at the frequency, which is practically important, and it has uniform permittivity along with the frequency and thus is preferable as an insulating material.

The size and thickness of the polyimide resin film may be appropriately adjusted according to the applied field, and for example, it has a thickness of 5 to 100 μm.

According to the another embodiment of the present invention, a preparation method of a polyimide resin film, which includes applying the polymer resin composition onto a substrate and heating the polymer resin composition applied onto the substrate, is provided.

As stated above, by using the polymer resin composition, the polyimide resin film having a low dielectric constant and excellent mechanical properties can be provided with a heat treatment without lowering the dielectric constant or an additional process for forming pores Further, in the process of forming a polyimide film by heat-treating the resin composition without the use of reagents and other solvents, the specific compounds described above are thermally decomposed, the prior manufacturing process of the polyimide film can be used as the manufacturing process of the circuit board, so it may be possible to improve the economy and efficiency of the process without residue after decomposition, to give a final product with excellent quality.

In the step of applying the polymer resin composition onto a substrate, any apparatus and coating method that is commonly used can be used without limitation, and for example, it is possible to use a method such as spraying, roll coating, rotary coating, knife coating, slit coating, extrusion coating, curtain coating, die coating, and a wire bar coating.

The available materials for the substrate where the polymer resin composition is applied are not greatly restricted, for example a metal substrate such as copper, a plastic substrate or polymer substrate, or a glass substrate can be used.

In the step of heating the polymer resin solution in the coating step, fine pores having a diameter of 5 μm to 100 nm and a polyimide polymer film which is formed by imidizing the polyamic acid are formed. In the heating process, conventional conditions and conventional methods which are well-known for heat curing of the polyamic acid can be used without limitation.

For example, the polymer resin composition including the polyamic acid or the dried product therefrom can be thermally cured by heating for 1 minute or more at a temperature of 50° C. or above, and specifically the heating is performed at 200° C. to 500° C. More specifically, the heating is performed at 200° C. to 430° C. for 1 minute to 3 hours, and preferable at 300° C. to 410° C. for 2 minutes to 60 minutes.

As stated above, the above-mentioned at least one compound selected from the group consisting of a polyalkylene oxide compound, a tetrahydropyran compound, polystyrene, a polyacrylate compound, and a copolymer thereof can be completely thermally decomposed even inside of the polymer resin composition or a polymer resin film in a range of more than 50° C., for example 200° C. to 500° C., preferably from 200° C. to 430° C., and more preferably from 300° C. to 410° C. Thus, fine pores having a diameter of 100 nm to 5 μm are distributed in a substrate of a polyimide polymer, and each of the pores is distributed in an independent state without connecting with other pores.

In case the heating temperature is too high, configuration of fine pores in the polyimide resin film can't be maintained. In case the heating temperature is too low, the thermal decomposition of the specific compounds described above may first be broken down, and appropriate fine pores are difficult to form.

In the heating step, it is possible that while raising the temperature gradually in the temperature range of 50° C. or more, specifically, it is carried out in sequential steps of heating at 190° C. to 250° C. for 10 minutes to 1 hour, at 250° C. to 300° C. for 1 minute to 2 hours, and at 300° C. to 400° C. for 1 minute to 1 hour.

The heating steps can be carried out in atmosphere conditions, and it is carried out in an inert gas atmosphere such as argon or nitrogen depending on the situation (for example, using anti-oxidation metal foil).

When the heating step is carried out in an inert gas atmosphere, a thermal decomposition temperature of at least one compound selected from the group consisting of a polyalkylene oxide compound, a tetrahydropyran compound, polystyrene, a polyacrylate compound, and a copolymer thereof becomes higher, and thus the size and uniformity of the fine pores distributed in the polyimide film can be adjusted appropriately.

Further, the heating step may be carried out by curing with gradually heating in an oven under a vacuum or nitrogen atmosphere, or continuously passing through at a high temperature in a nitrogen atmosphere.

The preparation method of polyimide resin further includes drying the polymer resin composition applied on the substrate. The polymeric resin solution coated on the substrate can be dried at a temperature of lower than the boiling point of the solvent, for example the drying is performed at 60° C. to 200° C. for 30 seconds to 30 minutes. In the drying step, it is possible to use an arch-type oven or a floating-type oven.

Meanwhile, according to another embodiment of the invention, a flexible metal laminate including the polyimide resin film as described above and a metal thin film is provided.

The metal thin film includes including one or more selected from the group consisting of copper, iron, nickel, titanium, aluminum, silver, gold, and an alloy of two or more of them, preferably the metal thin film is a copper clad film. A specific example of a metal laminate is a copper-clad laminate (CCL) or a flexible copper-clad laminate.

According to the characteristics or the use of the flexible metal laminate, the shape or form of the flexible metal laminate may be appropriately adjusted, and for example the flexible metal laminate may have a thickness of 100 μm to 1 μm.

The polyimide resin film can be formed by coating the polymer resin composition including a polyamic acid including a repeating unit represented by the Chemical Formula 1, and at least one compound selected from the group consisting of a polyalkylene oxide compound, a tetrahydropyran compound, polystyrene, a polyacrylate compound, and a copolymer thereof onto substrate, and heating the coated polymer resin composition.

The polyamic acid including a repeating unit represented by Chemical Formula 1 is imidized and the specific thermally decomposable compound is decomposed at the same time. Thus, a polyimide resin having a uniform distribution of fine pores can be provided.

In the polyimide resin film, fine pores having a diameter of 100 nm to 5 μm can be distributed in a substrate of a polyimide polymer including a repeating unit of Chemical Formula 11. The fine pores distributed in a substrate of a polyimide polymer have a uniform size, and specifically, the standard deviation of the size of the fine pores is 1.2 μm or less, and preferably 1.0 μm or less. Each of the fine pores is distributed in an independent state without connecting with other pores.

The polyimide resin film, which includes a heat cured product or dried product of the polymer resin composition, has porosity of 5 to 70%, and preferably 10 to 50%.

As the polyimide resin film described above has the porosity, it can have adequate mechanical properties and a low dielectric constant, for example a dielectric constant of 2.9 or less.

More specific contents to the polyimide resin film are the same as described above.

In the polyimide resin film, the compounds mentioned above, the at least one compound selected from the group consisting of a polyalkylene oxide compound, a tetrahydropyran compound, polystyrene, a polyacrylate compound, and a copolymer thereof, are decomposed during the heating, the fine pores are formed in the position where the compound had been located.

Thus, the polyimide resin film includes at least one compound selected from the group consisting of a polyalkylene oxide compound, a tetrahydropyran compound, polystyrene, a polyacrylate compound, and a copolymer thereof, or a variation by heat treatment thereof in a range of 500 ppmw or less, and preferably 200 ppmw or less, or the polyimide resin film is substantially free of the compound(s).

The 'variation by heat treatment thereof' means a resultant that is physically or chemically modified or a resultant formed in the heating decomposition when at least one compound selected from the group consisting of a polyalkylene oxide compound, a tetrahydropyran compound, polystyrene, a polyacrylate compound, and a copolymer thereof is heated, for example at 200° C. to 500° C.

In order to produce the flexible metal laminate, a method known for producing a metal laminate or a flexible metal laminate may be used without any limitations. For example, a metal laminate on which a polyimide film is formed can be obtained by coating the polymer resin composition onto a metal thin film and heating it. Alternatively, a polyimide film can be adhered or laminated to a metal thin film.

It is possible to use an adhesive such as an acrylic resin or epoxy resin commonly used for adhering the metal thin film and the polyimide resin film described above, but it is not limited thereto.

Further, as a method used to directly bind the metal thin film to the polyimide resin film, it is possible to use a process which is generally known, for example, after pre-lamination at a temperature of 25° C. to 50° C. with a method of roll bonding or flat pressing, the metal thin film and the polyimide resin film are laminated by a vacuum lamination method at a temperature of 60° C. to 90° C.

According to another embodiment of the present invention, a circuit board including the polyimide resin film described above is provided.

As described above, since it not only makes it possible to form fine pores formed by thermal decomposition of certain compounds described above, the polyimide resin shows a low dielectric constant and has excellent mechanical properties, it can be applied to various applications, for example in information processing that requires a high level of reliability or density or for a circuit board that is used in communications to realize an excellent effect.

Specific examples of the circuit board are a multilayer printed circuit board, a copper-clad laminate (CCL), and a flexible copper-clad laminate.

The polyimide resin film can be formed by coating the polymer resin composition including a polyamic acid including a repeating unit represented by Chemical Formula 1 and at least one compound selected from the group consisting of a polyalkylene oxide compound, a tetrahydropyran compound, polystyrene, a polyacrylate compound, and a copolymer thereof onto a substrate, and heating the coated polymer resin composition.

The polyamic acid including a repeating unit represented by Chemical Formula 1 is imidized, and the specific thermally decomposable compound is decomposed at the same time. Thus, a polyimide resin having a uniform distribution of fine pores can be provided.

In the polyimide resin film, fine pores having a diameter of 100 nm to 5 μm can be distributed in a substrate of a polyimide polymer including a repeating unit of Chemical Formula 11.

The fine pores distributed in a substrate of a polyimide polymer have a uniform size, and specifically, a standard deviation of the size of the fine pores is 1.2 μm or less, and preferably 1.0 μm less.

Each of the pores is distributed in the polyimide resin film in an independent state without connecting with other pores.

The polyimide resin film formed by heat-curing of the polymer resin composition can have porosity of 5 to 70%, and preferably of 10 to 50%.

As the polyimide resin film described above has the porosity, it can have adequate mechanical properties and a low dielectric constant, for example a dielectric constant of 2.9 or less.

More specific contents to the polyimide resin film are the same as described above.

The polyimide resin film includes at least one compound selected from the group consisting of a polyalkylene oxide compound, a tetrahydropyran compound, polystyrene, a polyacrylate compound, and a copolymer thereof, or a variation by heat treatment thereof in a range of 500 ppmw or less, and preferably 200 ppmw or less, or the polyimide resin film is substantially free of the compound.

The polyimide resin film can be used as a protection film of the circuit board, a base film of the circuit board, an insulating layer of the circuit board, a solder resist, or an interlayer insulating film of a semiconductor.

With the exception of the point that the polyimide resin film is used for the purposes described above, the manufacturing method and structure of the circuit board can be utilized techniques known in the related art.

Advantageous Effect of the Invention

According to the present invention, a polymer resin composition capable of providing an insulating material having a low dielectric constant and excellent mechanical properties, a polyimide resin film obtained by using the polymer resin composition, a preparation method of polyimide resin film, and a circuit board and a metal laminate including the polyimide resin film may be provided.

BRIEF DESCRIPTION OF THE DRAWING

FIG. 1 represents a SEM photograph of a cross-section of the polyimide film obtained by Example 1.

DETAILS FOR PRACTICING THE INVENTION

The present invention is explained in more detail in the following examples. However, the following examples are only for illustrating the present invention and the details of the present invention are not limited to or by them.

EXAMPLES AND COMPARATIVE EXAMPLES: PREPARATION OF POLYMER RESIN COMPOSITION AND POLYIMIDE FILM

Example 1

A polyamic acid was prepared by putting 8.56 g of 3,3',4,4'-biphenyltetracarboxylic dianhydride (BPDA), 6.25 g of 3,3',4,4'-benzophenonetetracarboxylic dianhydride (BTDA), and 5.24 g of phenylenediamine (PDA) into 125 mL of N-methylpyrrolidone and reacting them.

The polyamic acid, 4.18 g of methyl-terminated poly(ethylene glycol)-co-poly(propylene glycol) having a number average molecular weight (Mn) of 8000, and 0.1 g of dispersants of Hypermer KD-1 (Croda Inc.) were mixed to form a uniform solution (viscosity 8000 cps) was prepared.

The solution was coated on a glass substrate with a thickness of about 200 μm, the temperature was raised at a rate of 5° C./min in the ambient atmosphere, and the resultant was maintained for 30 minutes at around 400° C. to form a uniform polyimide film.

Example 2

A polyamic acid was prepared by putting 8.56 g of 3,3',4,4'-biphenyltetracarboxylic dianhydride (BPDA), 6.25 g of 3,3',4,4'-benzophenonetetracarboxylic dianhydride (BTDA), and 5.24 g of phenylenediamine (PDA) into 120 mL of N-methylpyrrolidone and reacting them.

The prepared polyamic acid and 3.34 g of heptakis(2,3,6-tri-O-methyl)-β-cyclodextrin were mixed, and a uniform solution (viscosity 15,000 cps) was prepared.

The solution was coated on a glass substrate with a thickness of about 200 μm, the temperature was raised at a rate of 5° C./min in the ambient atmosphere, and the resultant was maintained for 30 minutes at around 380° C. to form a uniform polyimide film.

Example 3

A polyamic acid was prepared by putting 14.66 g of 3,3',4,4'-biphenyltetracarboxylic dianhydride (BPDA) and 5.39 g of phenylenediamine (PDA) into 100 mL of N-methylpyrrolidone and reacting them.

The prepared polyamic acid, 8.35 g of sucrose octaacetate, and 0.7 g of a dispersant of Disperbyk-185 (BYK Co.) were mixed, and a uniform solution (viscosity 10,000 cps) was prepared.

The solution was coated with a thickness of about 200 μm on a 12 μm thick copper foil F2-WS (Furukawa Co.), temperature was raised at a rate of 5° C./min in a nitrogen atmosphere, and the resultant was maintained for 30 minutes at around 400° C. to form a uniform polyimide film.

Comparative Example 1

By putting 14.66 g of 3,3',4,4'-biphenyltetracarboxylic dianhydride (BPDA) and 5.39 g of phenylenediamine (PDA) into 150 mL of N-methyl pyrrolidone and reacting them, a solution of polyamic acid (viscosity 15,000 cps) was prepared.

The solution was coated on a glass substrate with a thickness of about 200 μm, the temperature was raised at a rate of 5° C./min in a nitrogen atmosphere, and the resultant was maintained for 30 minutes at around 380° C. to form a uniform polyimide film.

Comparative Example 1

11.11 g of 3,3',4,4'-biphenyltetracarboxylic dianhydride (BPDA), 4.04 g of phenylenediamine (PDA), and 4.90 g of mono-amino poly(ethylene glycol)-co-poly(propylene glycol) having a number average molecular weight (Mn) of 2000 were put into 100 mL of N-methylpyrrolidone, and a block copolymer (PAA polymer chains terminated with poly(ethylene glycol)-co-poly(propylene glycol)) solution was prepared.

The solution had a viscosity of 2500 cps, which is relatively low.

The solution was coated on a glass substrate with a thickness of about 200 μm, the temperature was raised at a rate of 5° C./min in a nitrogen atmosphere, and the resultant was maintained for 30 minutes at around 400° C. to form a uniform polyimide film.

Experimental Example: Measurement of Properties of the Prepared Polyimide Resin Film Properties of the polyimide films obtained in the above examples and comparative examples were determined as follows.

Experimental Example 1. Measurement of Permittivity

After an electrode was formed by using silver paste (Ag paste) on both surfaces of the films obtained in the examples and comparative examples, electrostatic capacitance at 1 MHz was measured using an impedance analyzer.

Permittivity was obtained from the electrostatic capacitance by using the General Formula 1 below Permittivity=(electrostatic capacitance*Thickness of Film)/(Area of Electrode*$\epsilon_0$)     [General Formula 1]

($\epsilon_0$=8.85*10$^{-12}$ F/m)

Experimental Example 2. Measurement of Pore Size

The cutting plane of the films obtained in the examples and comparative examples were photographed enlarged 5000 times or 1000 by using a microscope (SEM). The longest diameters of pores distributed in the films were measured, and the average value and standard deviation of the pore size were obtained from the results.

Experimental Example 3. Measurement of Porosity

By using an AG balance (METTLER-TOLEDO Company), density of the target film and a pore-less (dense) film were respectively measured, and then porosity of the film was calculated by the following General Formula 2.

Porosity (%)=(1−Density of the target film/Density of pore-less (dense)film)*100     [General Formula 2]

Experimental Example 4. Measurement of Tensile Strength

The films obtained in the examples and comparative examples were respectively elongated by the tensile tester with IPC-TM-650, 2.4.19 standard, and the stress at fracture was measured.

The results of Experimental Examples 1 to 4 are shown in Table 1 below.

TABLE 1

Results of Experimental Examples 1 to 4

| | Permittivity | Average value of the pore size | Standard deviation of the pore size | Porosity | Tensile strength |
|---|---|---|---|---|---|
| Example 1 | 2.3 | 0.8 μm | 0.6 μm | 35% | 104 MPa |
| Example 2 | 2.9 | 1.5 μm | 0.7 μm | 19% | 200 MPa |
| Example 3 | 2.4 | 1.7 μm | 0.9 μm | 32% | 108 MPa |
| Comparative Example 1 | 3.4 | — | — | — | 300 MPa |
| Comparative Example 2 | Not measured | 0.03 μm | | 3% | Not measured |

As shown in Table 1 above, polyimide resin films of the examples have an average pore diameter of 0.8 μm to 1.7 μm and porosity of 19% to 35%. Thus, it was recognized that films of the examples may have a low dielectric constant of 3.2 or less as well as excellent mechanical properties (tensile strength of more than 100 Mpa).

The pores in polyimide resin films of the examples have a standard deviation of the pore size of 0.9 or less, and it was recognized that the pores have a relatively uniform size.

In contrast, the polyimide resin film of Comparative Example 1, in which the pores are not formed, shows tensile strength of beyond a certain level. However, it has a high dielectric constant, and thus is difficult to apply to a field in which a high circuit density and high-speed operation are required.

Then, by using the resin composition of Comparative Example 2 including the polyamic acid having the thermally decomposable functional groups, the pores are formed in the polymer film. But since the size and the porosity of the pores are too small, the tensile strength is not secured, so the dielectric constant and the tensile strength were not measured.

What is claimed is:

1. A polymer resin composition comprising: a polyamic acid including a repeating unit represented by the following Chemical Formula 1; and a tetrahydropyran compound,

[Chemical Formula 1]

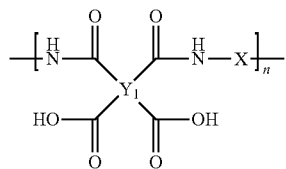

wherein, $Y_1$ is a tetravalent organic functional group, X is a divalent organic functional group, and n is an integer of 1 to 100, wherein the tetrahydropyran compound comprises at least a compound selected from the group consisting of sucrose, cyclodextrin, glucose, and derivatives thereof, or wherein the tetrahydropyran compound comprises at least a compound selected from the group consisting of a polymer compound including a repeating unit of the following Chemical Formula 2 and a compound of the following Chemical Formula 3:

[Chemical Formula 2]

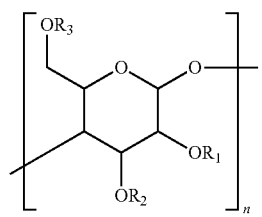

wherein, in Chemical Formula 2, $R_1$, $R_2$, and $R_3$ are same as or different from each other and are respectively hydrogen or an alkyl having 1 to 3 carbon atoms, and n is an integer of 1 to 10,

[Chemical Formula 3]

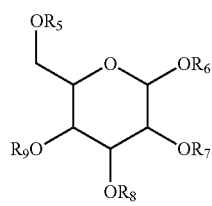

in Chemical Formula 3, $R_5$, $R_6$, $R_7$, $R_8$, and $R_9$ are same as or different from each other and are respectively hydrogen, an alkyl having 1 to 3 carbon atoms, a functional group of the following Chemical Formula 4, or a functional group of the following Chemical Formula 5,

[Chemical Formula 4]

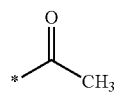

[Chemical Formula 5]

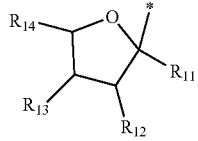

in Chemical Formula 5, $R_{11}$, $R_{12}$, $R_{13}$ and $R_{14}$ are same as or different from each other and are respectively hydrogen, an alkyl having 1 to 3 carbon atoms, an alkoxy having 1 to 3 carbon atoms, a functional group of the following Chemical Formula 6, or a functional group of the following Chemical Formula 7,

[Chemical Formula 6]

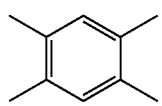

[Chemical Formula 7]

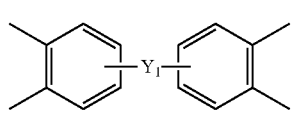

in Chemical Formulae 4 to 7, "*" means a bonding point.

2. The polymer resin composition according to claim 1, wherein the polyamic acid has a weight average molecular weight of 10,000 to 1,000,000.

3. The polymer resin composition according to claim 1, wherein $Y_1$ is a tetravalent organic functional group containing one to three aromatic rings; a tetravalent organic functional group containing one to three aliphatic ring; or a tetravalent aliphatic organic functional group derived from a linear or branched alkyl having 1 to 10 carbon atoms.

4. The polymer resin composition according to claim 1, wherein $Y_1$ is a tetravalent functional group selected from the group consisting of the following Chemical Formulae 21 to 35:

[Chemical Formula 21]

[Chemical Formula 22]

wherein, in Chemical Formula 22, $Y_1$ is single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 23]

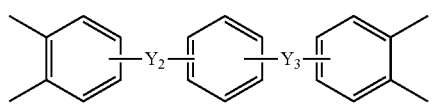

wherein, in Chemical Formula 23, $Y_2$ and $Y_3$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 24]

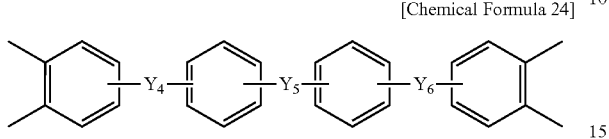

wherein, in Chemical Formula 24, $Y_4$, $Y_5$, and $Y_6$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 25]

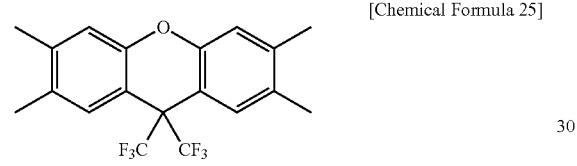

[Chemical Formula 26]

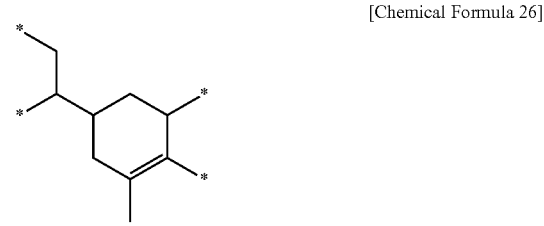

[Chemical Formula 27]

[Chemical Formula 28]

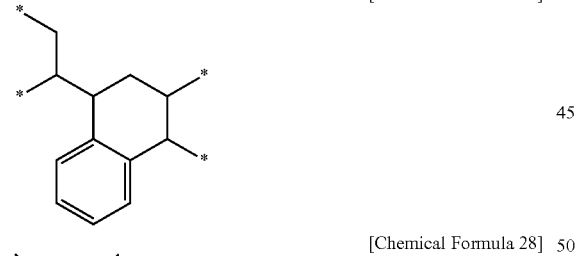

[Chemical Formula 29]

[Chemical Formula 30]

[Chemical Formula 31]

[Chemical Formula 32]

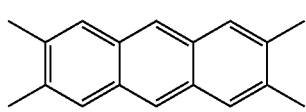

[Chemical Formula 33]

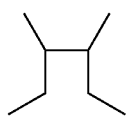

[Chemical Formula 34]

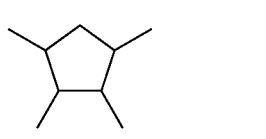

[Chemical Formula 35]

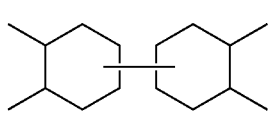

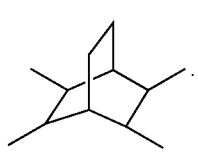

5. The polymer resin composition according to claim 1, wherein X is a divalent organic functional group selected from the group consisting of a divalent organic functional group containing 1 to 5 aromatic rings; a divalent organic functional group containing 1 to 3 aliphatic rings; a divalent organic functional group having a ether functional group or a ester functional group; and a polysiloxane divalent functional group.

6. The polymer resin composition according to claim 1, wherein X is a divalent functional group selected from the group consisting of compounds of the following Chemical Formulae 36 to 44:

[Chemical Formula 36]

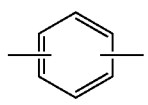

[Chemical Formula 37]

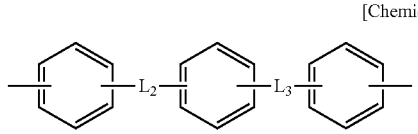

wherein, in Chemical Formula 37, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, and n1, n2, and n3 are respectively an integer of 1 to 10,

[Chemical Formula 38]

in Chemical Formula 38, $L_2$ and $L_3$ are the same as or different from each other and are respectively a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, —$OCH_2$—$C(CH_3)_2$—$CH_2O$—, or —$OCO(CH_2)_{n3}OCO$—, and n1, n2, and n3 are respectively an integer of 1 to 10,

[Chemical Formula 39]

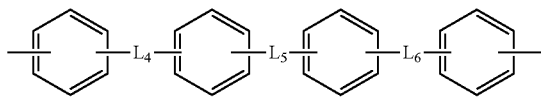

in Chemical Formula 39, $L_4$, $L_5$, and $L_6$ are the same as or different from each other and are respectively a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, —$OCH_2$—$C(CH_3)_2$—$CH_2O$—, or —$OCO(CH_2)_{n3}OCO$—, and n1, n2, and n3 are respectively an integer of 1 to 10,

[Chemical Formula 40]

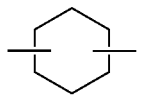

[Chemical Formula 41]

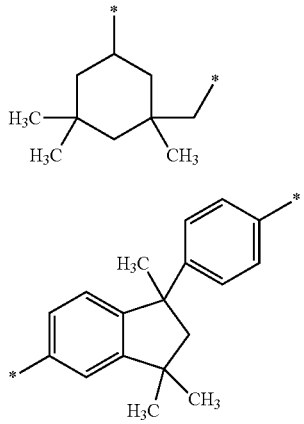

[Chemical Formula 42]

[Chemical Formula 43]

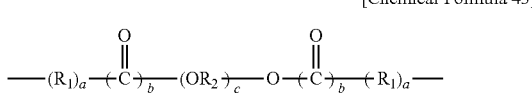

in Chemical Formula 43, $R_1$ is an alkylene having 2 to 8 carbon atoms or an arylene, $R_2$ is alkylene having 2 to 8 carbon atoms, a and b are each 0 or 1, and c is an integer from 1 to 21,

[Chemical Formula 44]

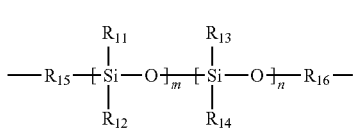

in Chemical Formula 44, $R_{11}$, $R_{12}$, $R_{13}$, and $R_{14}$ are the same as or different from each other and are respectively an alkyl group having 1 to 5 carbon atoms or an aryl group having 6 to 10 carbon atoms, $R_{15}$ and $R_{16}$ are respectively a linear or branched chain alkylene group having 1 to 20 carbon atoms, m is an integer of 1 or more, and n is an integer of 0 or more.

7. The polymer resin composition according to claim 1, further comprising an organic solvent.

8. The polymer resin composition according to claim 1, further comprising at least one additive selected from the group consisting of a dispersant, a surfactant, an antioxidant, a cure accelerator, a defoaming agent, an organic filler, and an inorganic filler.

9. A polyimide resin film comprising a heat cured product or dried product of the polymer resin composition according to claim 1.

10. The polyimide resin film according to claim 9, wherein fine pores having a diameter of 100 nm to 5 μm are distributed in a substrate of a polyimide polymer including a repeating unit of Chemical Formula 11:

[Chemical Formula 11]

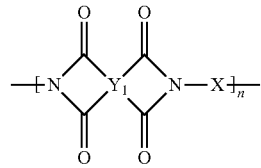

wherein, in Chemical Formula 11, $Y_1$ is a tetravalent organic functional group, X is a divalent organic functional group, and n is an integer of 1 to 100.

11. The polyimide resin film according to claim 10, having porosity of 5% to 70%.

12. The polyimide resin film according to claim 10, wherein each of the pores is distributed in an independent state without connecting with other pores.

13. The polyimide resin film according to claim 9, having a dielectric constant of 2.9 or less.

14. The polyimide resin film according to claim 9, having a thickness of 5 μm to 100 μm.

15. A preparation method of polyimide resin film, which comprises applying the polymer resin composition according to claim 1 onto a substrate, and heating the polymer resin composition applied on the substrate.

16. The preparation method of polyimide resin film according to claim 15, wherein the heating is performed at 200° C. to 500° C.

17. The preparation method of polyimide resin film according to claim 15, wherein the heating is performed at 200° C. to 430° C. for 1 minute to 3 hours.

18. The preparation method of polyimide resin film according to claim 15, which further comprises drying the polymer resin composition applied on the substrate.

19. The preparation method of polyimide resin film according to claim 18, wherein the drying is performed at 60° C. to 200° C. for 30 seconds to 30 minutes.

20. A flexible metal laminate including the polyimide resin film according to claim 9 and a metal thin film.

21. The flexible metal laminate according to claim 20, wherein fine pores having a diameter of 100 nm to 5 μm are distributed in the polyimide resin film, and
each of the pores is distributed in an independent state without connecting with other pores.

22. The flexible metal laminate according to claim 20, having a porosity of 5% to 70% and a dielectric constant of 2.9 or less.

23. The flexible metal laminate according to claim 20, comprising a tetrahydropyran compound or a variation formed by heat treatment thereof in a range of 500 ppmw or less.

24. The flexible metal laminate according to claim 20, which is a copper-clad laminate (CCL) or a flexible copper-clad laminate.

25. A circuit board comprising the polyimide resin film according to claim 9.

26. The circuit board according to claim 25, wherein fine pores having a diameter of 100 nm to 5 μm are distributed in the polyimide resin film, and
   each of the pores is distributed in an independent state without connecting with other pores.

27. The circuit board according to claim 25, wherein the polyimide resin film has porosity of 5% to 70% and a dielectric constant of 2.9 or less.

28. The circuit board according to claim 25, wherein the polyimide resin film comprises a tetrahydropyran compound or a variation formed by heat treatment thereof in a range of 500 ppmw or less.

29. The circuit board according to claim 25, wherein the polyimide resin film is used as a protection film of the circuit board, a base film of the circuit board, an insulating layer of the circuit board, a solder resist, or an interlayer insulating film of a semiconductor.

\* \* \* \* \*